United States Patent
Harizopoulos et al.

(10) Patent No.: US 9,431,074 B2
(45) Date of Patent: Aug. 30, 2016

(54) SHIFTABLE MEMORY SUPPORTING BIMODAL STORAGE

(75) Inventors: Stavros Harizopoulos, San Francisco, CA (US); Alkiviadis Simitsis, Santa Clara, CA (US); Harumi Kuno, Cupertino, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 32 days.

(21) Appl. No.: 14/381,859

(22) PCT Filed: Mar. 2, 2012

(86) PCT No.: PCT/US2012/027601
§ 371 (c)(1),
(2), (4) Date: Aug. 28, 2014

(87) PCT Pub. No.: WO2013/130108
PCT Pub. Date: Sep. 6, 2013

(65) Prior Publication Data
US 2015/0006809 A1    Jan. 1, 2015

(51) Int. Cl.
| | |
|---|---|
| *G06F 12/00* | (2006.01) |
| *G11C 7/10* | (2006.01) |
| *G06F 17/30* | (2006.01) |
| *G06F 12/02* | (2006.01) |
| *G06F 3/06* | (2006.01) |

(Continued)

(52) U.S. Cl.
CPC ........... *G11C 7/1036* (2013.01); *G06F 3/0608* (2013.01); *G06F 12/023* (2013.01); *G06F 17/30135* (2013.01); *G11C 19/00* (2013.01); *G11C 19/28* (2013.01); *G06F 2212/161* (2013.01); *G06F 2212/70* (2013.01); *G11C 13/0007* (2013.01)

(58) Field of Classification Search
CPC ........... G06F 12/023; G06F 17/30135; G06F 2212/161; G06F 2212/70; G06F 3/0608; G11C 7/1036; G11C 19/00; G11C 19/28; G11C 13/0007
See application file for complete search history.

(56) References Cited

U.S. PATENT DOCUMENTS

| | | |
|---|---|---|
| 3,670,313 A | 6/1972 | Beausoleil et al. |
| 3,708,690 A | 1/1973 | Paivinen |

(Continued)

FOREIGN PATENT DOCUMENTS

| | | |
|---|---|---|
| EP | 0237337 A2 | 9/1987 |
| EP | 0827156 | 4/1998 |

(Continued)

OTHER PUBLICATIONS

Athanassoulis at al., MASM: Efficient Online Updates in Data Warehouses, ACM Speciai Interest Group on Management of Date Conference, Jun. 2011. 12 pages.

(Continued)

*Primary Examiner* — Shawn X Gu
(74) *Attorney, Agent, or Firm* — North Shore Associates

(57) ABSTRACT

A shiftable memory supporting bimodal data storage includes a memory having built-in shifting capability to shift a contiguous subset of data stored in the memory from a first location to a second location within the memory. The shiftable memory further includes a bimodal data storage operator to operate on a data structure comprising the contiguous subset of data words and to provide in-place insertion of a data value using the built-in shifting capability.

14 Claims, 6 Drawing Sheets

(51) Int. Cl.
*G11C 19/00* (2006.01)
*G11C 19/28* (2006.01)
*G11C 13/00* (2006.01)

(56) References Cited

U.S. PATENT DOCUMENTS

| | | |
|---|---|---|
| 3,760,382 A | 9/1973 | Itoh |
| 3,797,002 A | 3/1974 | Brown |
| 3,812,336 A | 5/1974 | Bossen et al. |
| 3,893,088 A | 7/1975 | Bell |
| 4,037,205 A | 7/1977 | Edelberg et al. |
| 4,133,043 A | 1/1979 | Hiroshima et al. |
| 4,322,635 A | 3/1982 | Redwine |
| 4,521,874 A | 6/1985 | Rau et al. |
| 4,532,606 A | 7/1985 | Phelps |
| 4,845,670 A | 7/1989 | Nishimoto et al. |
| 4,903,240 A | 2/1990 | Von Flue |
| 5,153,846 A | 10/1992 | Rao |
| 5,299,156 A | 3/1994 | Jaing et al. |
| 5,313,433 A | 5/1994 | Waller |
| 5,504,919 A | 4/1996 | Lee et al. |
| 5,543,748 A | 8/1996 | Ando |
| 5,612,964 A | 3/1997 | Haraszti |
| 5,677,864 A * | 10/1997 | Chung .................. G06F 9/3879 365/230.03 |
| 5,698,997 A | 12/1997 | Williamson et al. |
| 5,860,104 A | 1/1999 | Witt et al. |
| 5,930,323 A | 7/1999 | Tang et al. |
| 6,021,075 A | 2/2000 | Ueno |
| 6,061,417 A | 5/2000 | Kelem |
| 6,239,638 B1 | 5/2001 | Masuda |
| 6,362,660 B1 | 3/2002 | Deng |
| 6,526,505 B1 | 2/2003 | Epstein |
| 6,678,806 B1 | 1/2004 | Redford |
| 6,745,216 B1 | 6/2004 | Nakamura |
| 6,820,186 B2 | 11/2004 | Webber et al. |
| 6,834,005 B1 | 12/2004 | Parkin |
| 7,051,153 B1 | 5/2006 | Lin et al. |
| 7,308,553 B2 | 12/2007 | Liang |
| 7,508,701 B1 | 3/2009 | Liang et al. |
| 7,573,310 B2 | 8/2009 | Yang et al. |
| 7,608,849 B2 | 10/2009 | Ino et al. |
| 7,791,376 B2 | 9/2010 | Lim et al. |
| 2002/0089024 A1 | 7/2002 | Iwata |
| 2004/0027863 A1 | 2/2004 | Lee et al. |
| 2004/0239606 A1 | 12/2004 | Ota |
| 2005/0138501 A1 | 6/2005 | Motika et al. |
| 2007/0080345 A1 | 4/2007 | Joo et al. |
| 2007/0083571 A1 | 4/2007 | Meller et al. |
| 2007/0211531 A1 | 9/2007 | Atti et al. |
| 2008/0071748 A1 | 3/2008 | Wroblewski et al. |
| 2009/0294869 A1 | 12/2009 | Chen |
| 2011/0106742 A1 | 5/2011 | Pino |
| 2012/0138885 A1 | 6/2012 | Wu et al. |

FOREIGN PATENT DOCUMENTS

| | | |
|---|---|---|
| JP | 2005071500 | 3/2005 |
| WO | WO-2013002772 | 1/2013 |

OTHER PUBLICATIONS

Lee et al., "High-Speed Median Filter Designs Using Shiftable Content-Addressable Memory," IEEE Trans. Circuits and Systems for Video Tech.V4, #6, Dec. 1994,544-549.

PCT Search Report/Written Opinion ~ Application No. PCT/US2012/0257601 dated Nov. 28, 2012 ~ 9 pages.

Roberto Perez-Andrade et al., "A Versatile Linear Insertion Sorter Based on a FIFO Scheme," IEEE Computer Society Annual Sympsiumon on VLSI, 2008, pp. 357-362.

Bender et al., Insertion Sort is O (n log n), In Proceedings of the Third International Conference on FunWith Algorithms (FUN), 2004 (6 pages).

Chen-Yi Lee et al., "High-Speed Median Filler Designs Using Shiftable Content-Addressable Memory," IEEE Trans. Circuits and Systems for Video Tech., vol. 4, No. 6, Dec. 1994, pp. 544-549.

Chudnovskiy, F. et al., "Switching Device Based on First-order Metalinsulator Transition Induced by External Electric Field," IEEE Future Trends in Microelectronics: the Nano Millennium, Wiley Interscience, 2002, pp. 148-155.

European Patent Office, Extended EP Search Report, Application No. 11868835.7-1805 dated Feb. 3, 2015 (8 pages).

Han et al., Integer Sorting in (n √loglog n) Expected Time and Linear Space, 2002 (10 pages).

IEEE P1003.1, Draft 6, Apr. 2001/Open Group Technical Standard, Issue 6, Draft Standar, for Information Technology—Portable Operating System Interface (POSIX) (23 pages).

Mikkel Thorup, Chapter 1—On RAM priority queues, 1996 (9 pages).

PCT Search Report, PCT/US2011/058461, May 31, 2012, 3 Pages.

PCT Search Report/Written Opinion ~ Application No. PCT/US2011/042223 dated Jan. 2, 2012 ~ 8 pages.

Pickett et al., "Coexistence of Memristance and Negative Differential Resistance in a Nanoscale Metal-Oxide-Metal System," IEEE Advanced Materials, 2011, pp. 23, 1730-1733.

Stephen C. Johnson, Algorithms for the 21st century presented at the 2006 USENIX Annual Technical Conference, Boston, MA, vol. 31, No. 5 (7 pages).

* cited by examiner

| 00 | 01001000 |
| 01 | 01111000 |
| 02 | 11001000 |
| 03 | 01001110 |
| 04 | 11001010 |
| 05 | 01001010 |
| 06 | 11111011 |
| 07 | 00000001 |
| 08 | 11011011 |
| 09 | 01101111 |
| 10 | 11101011 |
| 11 | 01111010 |

| 00 | 01001000 |
| 01 | 01111000 |
| 02 | 11001000 |
| 03 | 01001110 |
| 04 | X |
| 05 | 11001010 |
| 06 | 01001010 |
| 07 | 11111011 |
| 08 | 00000001 |
| 09 | 11011011 |
| 10 | 11101011 |
| 11 | 01111010 |

*FIG. 1A*

| 00 | abc |
| 01 | def |
| 02 | ghi |
| 03 | jkl |
| 04 | mno |
| 05 | pqr |
| 06 | stu |
| 07 | vwx |
| 08 | yza |
| 09 | bcd |
| 10 | efg |
| 11 | hij |

| 00 | abc |
| 01 | def |
| 02 | jkl |
| 03 | mno |
| 04 | pqr |
| 05 | stu |
| 06 | X |
| 07 | vwx |
| 08 | yza |
| 09 | bcd |
| 10 | efg |
| 11 | hij |

*FIG. 1B*

SHIFTABLE MEMORY SUPPORTING BIMODAL STORAGE

CROSS-REFERENCE TO RELATED APPLICATIONS

N/A

STATEMENT REGARDING FEDERALLY SPONSORED RESEARCH OR DEVELOPMENT

N/A

BACKGROUND

Modern computers and related processing systems typically include a processor and some form of memory. The processor is generally responsible for performing the various computational tasks of the computer while the memory stores data that is used in and generated by the computational tasks. The architectural division of processing by the processor and data storage by the memory has proven successful for nearly the entire history of such systems.

For example, a typical general-purpose computer usually includes a central processing unit (CPU) and a main memory that communicate with one another over one or more communication channels (e.g., data, command and address buses). Typically, the CPU provides facilities to perform various arithmetic and logical operations, to provide operational sequencing, and to otherwise control aspects of the general-purpose computer. For example, virtually all CPUs provide functions or operations for reading data from memory, writing data to memory and executing programs comprising a set of instructions that utilizes the data to perform a predefined task. In addition, CPUs may handle input/output (I/O) allowing communication with peripherals as well as subsystems outside of the general-purpose computer. CPUs may even provide graphics processing to handle generating and updating a graphical display unit (e.g., a monitor), in some examples.

In contrast, the main memory of modern computers, which can include one or more of static random access memory (SRAM), dynamic random access memory (DRAM), read-only memory (ROM), programmable ROM (PROM), flash memory and a variety of other memory types, typically provides a relatively narrow set of capabilities. Principal among these capabilities is storing computer programs and data that are executed and used by the CPU. Among other limited capabilities that may be found in or that are often associated with the main memory of modern computers are certain memory management functions. For example, DRAM memory subsystems of main memory may possess circuitry for automatic refresh of data stored therein.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which:

FIG. 1A illustrates an example of a downshift of a contiguous subset of data stored in a linear array within a shiftable memory, according to an example consistent with the principles described herein.

FIG. 1B illustrates an example of an upshift of a contiguous subset of data stored in a linear array within a shiftable memory, according to an example consistent with the principles described herein.

Figures 2, 3:
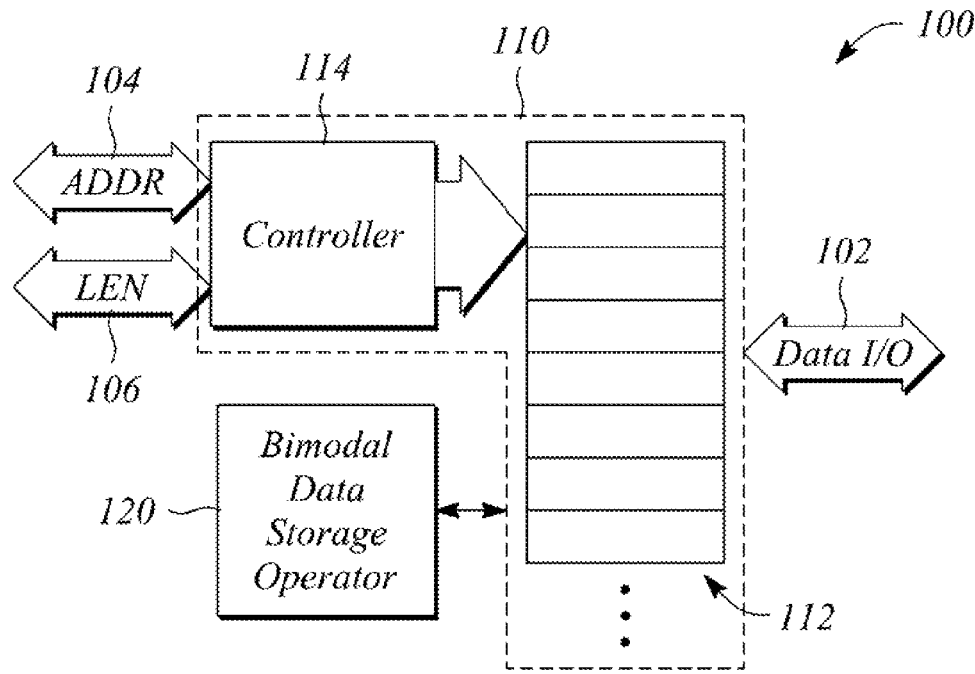
FIG. 2 illustrates a block diagram of a shiftable memory supporting bimodal data storage, according to an example consistent with the principles described herein.
FIG. 3 illustrates a portion of a truth table of an augmented decoder, according to an example consistent with the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein employ a shiftable memory to provide bimodal data storage with in-place data insertion and in-place data deletion. In particular, the shiftable memory provides data shifting capability that is substantially built into the memory, according to various examples of the principles described herein. The built-in data shifting capability facilitates a translation or shift of a contiguous subset of data stored in the memory. According to various examples, the shift may be employed to realize one or both of in-place insertion of data and in-place deletion of data in a data structure stored in the memory. Examples in accordance with the principles described herein have application to a variety of database configurations and systems including, but not limited to, column-store database systems.

According to various examples, the contiguous subset of stored data (e.g., data words) may be shifted within the memory from a memory first or initial location to a second or final location in the memory. The data retain an ordered relationship within the contiguous subset when shifted to the second location, according to some examples. Moreover, the shift takes place entirely within the memory and the shift is generally accomplished without using resources, such as a processor, that are outside of the memory. Further, the shift does not involve data being moved between a processor and the memory, according to various examples. As a result, the memory with built-in shifting capability is referred to as 'shiftable memory' herein.

In some examples, the shift provided by the shiftable memory herein may be employed to 'open' a location in memory to facilitate insertion of new data (e.g., new data values). In particular, during an operation on a data structure, a memory location either above or below the contiguous subset of stored data may be rendered available for data insertion when the contiguous subset of stored data is moved by the shift within the shiftable memory. Then data may be added or inserted into the opening as a further part of bimodal data storage operation, for example.

According to other examples, the shift may be used to delete or 'overwrite' data stored one of above a beginning of the contiguous subset and below an end of the contiguous subset. In particular, during a bimodal data storage operation the data stored above or below the contiguous subset may be overwritten with a portion of the contiguous subset itself, when the contiguous data is shifted by the shiftable memory. For example, if the contiguous subset of stored data is part of a larger data structure (e.g., an array of data words) in the shiftable memory, the shift may have the effect of deleting a portion of the data (e.g., one or more data words) in the larger data structure as part of the data structure operation.

According to some examples, shifting data to either insert data or delete data in the shiftable memory may be accomplished in less time, and in some examples in considerably less time, than is generally possible without using shiftable memory. In contrast, conventional memory that relies on a processor, for example, to perform a shift generally requires an amount of time that is proportional to an amount of data being shifted. For example, shifting data in conventional memory typically involves the processor reading the data to be shifted and then writing the data back to memory in another location. Reading and writing may be performed by the processor on a word-by-word basis due to the structure and functionality of conventional memory, for example. Since each data word in the data being shifted is first read from the conventional memory by the processor and then subsequently written back to the conventional memory, the time to shift the data is generally proportional to the amount or length of the data (e.g., number of data words) being shifted, for example. The larger the amount of data, the longer the shift operation will take.

Moreover, conventional memory relies on a resource (e.g., the processor) that is external to the conventional memory to perform the reading and writing when shifting the data. Since the resource performing the shift is external to the conventional memory, each of the data words involved in the word-by-word shift must pass between the external resource and the conventional memory through some form of data bus or similar communication channel. The data bus or similar communication channel may substantially limit a speed of the read and write operations and as a result, an overall speed of the shift. Hence, shifting large subsets of data can become prohibitively expensive in terms of the processing time due to one or both of the effects of data bus speed and the proportional time aspects of performing a shift using conventional memory.

In accordance with the principles described herein, shiftable memory has built-in shifting capability so that data is not read and then written by an external resource to perform a shift, for example. The contiguous subset of stored data is identified to the shiftable memory (e.g., using an address and a length) and the shiftable memory is instructed to shift the contiguous subset. The shift is then accomplished by and takes place entirely within the shiftable memory. Speed limitations associated with transferring data to and from an external resource are substantially eliminated by shiftable memory, according to examples of the principles described herein. Moreover, time for shifting may be substantially independent of the length of the contiguous subset, for example.

According to various examples, shifting within the shiftable memory may be implemented with circuitry of the shiftable memory itself. As such, shifting using shiftable memory does not require sequentially reading and writing each data word of the contiguous subset. For example, shifting using shiftable memory may shift all of the data in the contiguous subset in a substantially simultaneous manner. As such, the shiftable memory may implement shifting of the contiguous subset in a time that is substantially independent of the length of the contiguous subset.

In some examples, the shiftable memory may perform the shift in substantially constant time, according to the principles described. By 'constant time' it is meant that a substantially similar amount of time is required to shift the contiguous subset of stored data regardless of the length of the contiguous subset. For example, an arbitrary length contiguous subset may be shifted in a single clock cycle, according to some examples. In another example, a shorter contiguous subset may need only a single clock cycle while a longer contiguous subset may require two or more clock cycles. However, while the shiftable memory may use more time for longer subsets than relatively shorter subsets, the shift is still performed in substantially constant time since the time required is not strictly proportional to the contiguous subset length.

Herein, the term 'memory' refers to any sort of memory that can receive and store data. The memory is generally consistent with memory that may be employed by a computer processor or in a computer system, for example. In particular, by definition herein, memory refers to any sort of memory that can be written to and read from during operation of the computer that employs the memory. For example, the memory may comprise random access memory (RAM). The random access memory may be static RAM (SRAM), for example. Other types of memory include, but are not limited to, dynamic random access memory (DRAM), flash and similar non-volatile memories that are writable during operation of the computer, various forms of optical memory (e.g., re-writable optical discs), magnetic memory (e.g., computer hard drives) and various memory structures based on latches, flip-flops and other bi-stable constructs.

Also herein by definition, a memory may comprise a plurality of groups of memory cells. A plurality of memory cells may be also be arranged as an array, according to some examples. For example, the memory cells may be arranged as a linear array. In another example, the memory cells are arranged in a two dimensional (2-D) array. Higher order (e.g., three or more dimensions) arrays also may be employed. In some examples, a lower order array (e.g., a linear array) is defined on an array with a larger dimension (e.g., 2-D array). For example, a linear array may be defined by an addressing arrangement on a rectangular 2-D array of memory cells. In addition, arrays may be divided into sub-arrays. For example, a 2-D array may be divided into quadrants as four sub-arrays. According to various examples, the array may be either a physical array or a logical array. A physical array comprises memory cells that are physically organized or located relative to one another according to or as defined by the array. A logical array comprises a logical arrangement of the memory cells as an array. In a logical array, a physical arrangement of the memory cells may differ from the logical arrangement defined by the array, for example. Logical arrays may be defined using address indirection, for example.

A 'memory cell' is a circuit or a related construct that holds or stores data, as defined and employed herein. Further, by definition herein, memory cells may store one or more 'bits' of data. For example, the bit may be a binary value (e.g., '0' or '1') and the memory cell may hold a single bit. In another example, the memory cell may hold a plurality of binary value bits. In particular, the memory cell may hold or store a complete data word comprising the plurality of bits, as defined herein. For example, a memory cell may hold 4, 8, 16, 32 or 64 binary bits. In yet another example, the memory cell may hold data in another form (e.g., a hexadecimal value, an analog value, etc.). In particular, memory cells, as defined herein, are not restricted to storing data in a binary format but in some examples, may hold or store an arbitrary data construct. However, for discussion purposes herein, binary data is generally employed throughout by way of example and not by way of limitation, unless otherwise stipulated.

Memory cells are also often referred to as 'memory locations' herein. Strictly speaking, a memory location is a memory cell(s) at a particular location within the memory, the location being designated or identified by an address. The memory cell is accessed using the address, for example. However, for simplicity of discussion herein, memory cells are generally referred to as having or being at an address. Addresses or locations may be associated with a shiftable unit (e.g., a data word) of the memory, for example. As such 'location' and 'address' may be employed interchangeably herein. In addition 'location' may be used to refer to a location of a contiguous set of data that is designated by a starting address and an ending address, according to some examples. In other examples, the location of the contiguous set may be designated by a starting (or an ending) address and a length of the contiguous set.

Adjacent memory cells as defined by adjacent memory locations may be physically adjacent (i.e., located next to one another) or logically adjacent, by definition herein. Logical adjacency may be established by an overlying logical memory structure (e.g., using indirection), according to some examples. For example, logically adjacent memory cells may be physically separated from one another but still be considered adjacent in terms of an overlying memory structure that employs interleaving. Likewise, the contiguous subset may be physically contiguous (i.e., located in physically adjacent memory cells) or logically contiguous. In particular, the contiguous subset of data as stored in the adjacent memory cells of the shiftable memory acquires a contiguity that is analogous to and dictated by the adjacency of the memory cells, by definition herein.

Further herein and as noted above, a 'shift' as performed by shiftable memory is defined as a translation of a contiguous subset of data stored within the memory, unless otherwise stipulated. In particular, by definition herein, a shift using shiftable memory constitutes the translation (e.g., up or down an array) of the stored data (e.g., data words) within the contiguous subset from a first location to a second location within the memory. Furthermore, the shift, when applied to the contiguous subset of stored data, translates all of the stored data within the contiguous subset. Moreover, the shift by shiftable memory does not result in a translation or shift of data outside of the subset of data involved in the shift, by definition herein. In general, the shift may move the data by a distance of one or more memory locations or memory addresses. For example, the shift may move the data a single memory location up or down within the memory.

Herein, shift directions 'left' and 'up' are defined with respect to memory locations within the shiftable memory as a shift direction toward locations having smaller addresses. The shift directions 'right' and 'down' are defined as a direction toward locations having larger addresses. Hence, an 'upshift' or a 'left shift' is defined as shifting the data to a second location having a smaller address than an address of a first or starting location. Conversely, a 'downshift' or a 'right shift' results in moving the data from a first location having a smaller address to a second location with a larger address. However, while the shift direction is controllable or selectable according to some examples, the shift direction (e.g., left, right, up or down) may be completely arbitrary with respect to the physical address space, as employed herein. Further, the specific use of 'left shift', 'right shift', 'upshift' and 'downshift' herein is for discussion purposes and is not a limitation.

FIG. 1A illustrates an example of a downshift of a contiguous subset of data stored in a linear array within a shiftable memory, according to an example consistent with the principles described herein. In particular, FIG. 1A illustrates a plurality of memory cells, each of which is capable of storing a data word. For example, the data words may comprise eight binary bits, each bit (e.g., either a '1' or '0') being stored in a separate one of eight memory cells. Further as illustrated, each of the illustrated memory cells is identified by an address ranging from 00 to 11. A left side of FIG. 1A illustrates the plurality of memory cells before the downshift while a right side illustrates the same plurality of memory cells after the downshift. Note that the downshift illustrated in FIG. 1A may be viewed equivalently as a right shift by rotating the illustrated linear array by ninety degrees counterclockwise.

As illustrated, the example downshift within the shiftable memory comprises selecting a contiguous subset of stored data words starting with a memory cell at address 04 and ending with a memory cell at address 08, for example. The selected contiguous subset contains data words {10101010, 01001010, 11111011, 0000001, 11011011} in the illustrated example. The shiftable memory then downshifts the selected contiguous subset of data words by moving the stored data words down one address location, for example, as illustrated in the right side of FIG. 1A. The downshift maintains an order of the data words within the contiguous subset and deposits the contiguous subset in memory cells between address 05 and address 09. Downshifting the stored data overwrites the contents of a memory cell immediately below the contiguous subset (i.e., at address 09) and replaces the contents of that memory cell with a last data word (i.e., '11011011') of the downshifted contiguous subset. Further, the memory cell at address 04 which originally held the first data value of the contiguous subset is rendered indeterminate as indicated by the 'X'. According to various examples, the memory cell at address 04 may retain a copy of the data word (e.g., '11001010') that was present before the downshift or may be cleared (e.g., set to '00000000') after the downshift.

In some examples, the memory cell at address 04 may be available for insertion of a data word from an external source, for example. A data word may be inserted into the memory cell at address 04 by sequentially presenting and clocking individual bits of the inserted data word into the memory cell at address 04 (e.g., a serial write), according to some examples.

FIG. 1B illustrates an example of an upshift of a contiguous subset of data stored in a linear array within a shiftable memory, according to an example consistent with the principles described herein. In particular, FIG. 1B illustrates a plurality of memory cells each of which stores a data word (e.g., 'abc,' 'def,' etc.). Further as illustrated, each of the illustrated memory cells is identified by an address ranging from 00 to 11. A left side of FIG. 1B illustrates the plurality of memory cells before the upshift while a right side illustrates the same plurality of memory cells after the upshift. Note that the upshift illustrated in FIG. 1B may be viewed equivalently as a left shift by rotating the illustrated linear array by ninety degrees counterclockwise.

As illustrated in FIG. 1B, the upshift in shiftable memory comprises selecting a contiguous subset of stored data words starting with a memory cell at address 03 and ending with a memory cell at address 06, for example. The shiftable memory then upshifts the selected contiguous subset by moving the stored data words in the selected contiguous subset up one address location, for example, as illustrated in the right side of FIG. 1B. The upshift maintains an order of the words within the contiguous subset and deposits the contiguous subset in memory cells between address 02 and address 05. Upshifting the stored data words overwrites the contents of a memory cell immediately above the contiguous subset (i.e., at address 02) replacing the contents of that memory cell with a first word (i.e., 'jkl') of the upshifted contiguous subset. Further, the memory cell at address 06 which originally held the last word of the contiguous subset is rendered indeterminate as indicated by the 'X'. According to some examples, the memory cell at address 06 may retain a copy of the data word (e.g., 'stu') that was present before the upshift or may be cleared (e.g., set to '000') after the upshift. In some examples, the memory cell at address 06 may be available for insertion of data from an external source, for example.

According to some examples, the shiftable memory may be a portion of a main memory of a general-purpose computer system. For example, the shiftable memory may represent a subset of the memory that makes up the main memory. Furthermore according to various examples, the shiftable memory is distinct from memory cells, cache and other relatively small memory structures often found integrated together with other components (e.g., an arithmetic logic unit, controller, etc.) in a microprocessor, for example. For example, shiftable memory may include many megabytes or more (gigabytes, etc.) of memory storage whereas processor memory storage typically may be limited to less than a few tens of bytes (e.g., processor registers) to a few megabytes (e.g., L1 cache, L2 cache, etc.), for example. According to some examples, the shiftable memory may be a specialized partition of the main memory or a subsystem thereof.

Herein, a 'data structure' is defined as a structure in memory that contains and provides an organization of data stored in the shiftable memory. Examples of data structures include, but are not limited to, arrays and lists, strings, and various databases. For example, data structures as defined herein may include either a row-store database or a column-store database. In particular, the data structure is defined on the shiftable memory and is configured to contain data (e.g., data words comprising data values). The data contained by the data structure may comprise the contiguous subset of data that is shifted by the shiftable memory, according to various examples. In some examples, the data structure further comprises data that is not part of the contiguous subset. The data that is not part of the contiguous subset still may be in the shiftable memory, in some examples.

In some examples, the data structure still further comprises data that is stored outside of the shiftable memory. For example, the data structure may encompass or span both conventional memory and the shiftable memory. In some examples, the data structure may be substantially located in conventional, non-shiftable memory with portions of the data stored in the data structure being moved (e.g., moved temporarily) into the shiftable memory. For example, the data may be moved for the purposes of shifting the contiguous subset of data. After shifting, data comprising some or all of the shifted contiguous subset of data may be moved from the shiftable memory back into conventional memory, for example.

Further herein, 'bimodal data storage' is defined data storage (e.g., in a data structure) in which stored data is categorized by or distinguished as being stored in either of two types or modes. For example, data values in a data structure (e.g., a column-store database) may be distinguished as being stored as either a 'padded' data value or a 'non-padded' data value. For example, a 'padded' data value may be a data value that includes padding data. The padding data may comprise a string of padding characters or padding bits (e.g., a predetermined bit sequence that may be recognized as padding) as opposed to actual data, for example. In some examples, a padded data value may be referred to as a 'modified' data value to distinguish it from a data value that has not been modified to include padding. On the other hand, a 'non-padded' or 'unmodified' data value is defined as a data value that includes actual data stored by the data structure. Data may be stored and distinguished according to the bimodal data storage at either a data value level (e.g., as a data value) or a data word level, according to various examples. For example, a 'padded' or 'modified' data word may be a data word that includes a combination of padded data values and non-padded data values. A data word has or comprises one or more data values, by definition.

By definition herein, the bimodal data storage includes a mechanism that facilitates distinguishing data values or data words as being a member of a particular one of the two storage modes or types. For example, bimodal data storage may employ an identifier such as, but not limited to, a flag, a tag or a control bit, that allows the stored data (e.g., as a data value or a data word) to be distinguished. A control bit equal to a binary '1' associated with a data value may indicate that the data value is a padded data value, for example. In another example, a binary '0' control bit of a data word may identify the data word as being unmodified or unpadded. In some examples, data stored in the data structure according to bimodal data storage is compressed data. For example, the data may be compressed using a run-length encoding or another encoding technique.

Further, as used herein, the article 'a' is intended to have its ordinary meaning in the patent arts, namely 'one or more'. For example, 'a memory cell' means one or more memory cells and as such, 'the memory cell' means 'the memory cell(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Moreover, examples herein are intended to be illustrative only and are presented for discussion purposes and not by way of limitation.

FIG. 2 illustrates a block diagram of a shiftable memory 100 supporting bimodal data storage, according to an example consistent with the principles described herein. The shiftable memory 100 provides moving or shifting of a contiguous subset of data in the shiftable memory 100. The data may be in the form of data words, for example. The data words may each comprise one or more data values, for example. Shifting of data (e.g., data words) by the shiftable memory 100 shifts only the data in the contiguous subset and not other data outside of the contiguous subset. In particular, when the shiftable memory 100 performs a shift of the contiguous subset, only data of the contiguous subset is shifted, according to various examples. The shift does not shift other data located outside of the contiguous subset, for example. Further, the shift moves the contiguous subset of data without substantially changing or otherwise affecting an order of the data in the contiguous subset, according to some examples.

Additionally, the shiftable memory 100 supports bimodal data storage. The bimodal data storage may be with respect to data stored in one or more in-memory data structures defined on the shiftable memory 100. By 'defined on' it is meant that the data structure employs memory comprising the shiftable memory 100 to store data of the data structure, by definition herein. Further by definition herein, 'in-memory' means that the data structure is in memory (i.e., stores data in memory) and that the memory comprises the shiftable memory 100. For example, the in-memory data structure may store data in both of the shiftable memory 100 and conventional or 'non-shiftable' memory, according to some examples. The data structure may comprise a database for example. The database may be a column-store database, for example.

In some examples, an external resource (e.g., a processor) communicates data to and from the shiftable memory 100 via a data bus (Data I/O) 102. For example, data to be stored in the shiftable memory 100 may be communicated from the external resource to the shiftable memory 100 via the data bus 102. Similarly, data that is stored in and subsequently read from the shiftable memory 100 may be communicated to the external resource from the shiftable memory 100 via the data bus 102, for example. Moreover, information used to control an operation of the shiftable memory 100 such as, but not limited to, an address and a length of the contiguous subset, may be communicated to the shiftable memory 100 using an address bus (ADDR) 104 and a length bus (LEN) 106, according to some examples. A single address bus that carries both the address and the length or alternatively, a pair of addresses, may be employed in other examples (not illustrated).

As illustrated, the shiftable memory 100 supporting bimodal data storage comprises a memory 110 to store data. As mentioned above, the data may be stored as data words, according to some examples. The memory 110 has or provides built-in shifting capability to shift a contiguous subset of the data words from a first location to a second location within the memory 110. In particular, the built-in shifting capability is configured to shift the contiguous subset of data words substantially within the memory 110. During the shift, the data words are not transferred out of the memory 110 to accomplish the shift, according to various examples. For example, the second location may represent a shift relative to the first location of a single unit of data (e.g., a data word). The shift may be accomplished by moving data along pathways within the memory 110 from the first location to an adjacent location of the memory 110 representing the second location, for example.

Moving data to the adjacent location is referred to as an 'adjacent-location transfer' herein. In another example, the shift may move the contiguous subset of data by more than one data unit (e.g., two or more data words). A shift of two or more data units may be accomplished by a direct shift using internal data pathways of the memory 110 from the first location to the second location that is two or more data units distant from the first location, for example. In other examples, the memory 110 having built-in shifting capability may move the data in a series of smaller steps (e.g., a plurality of adjacent-location transfers) to achieve the shift of more than one data unit. However, in each example, the built-in shifting capability of the memory 110 accomplishes the shift substantially without relying on or employing a transfer of the data in and out of the memory 110, according to various examples of the principles described herein.

According to some examples, the memory 110 comprises a plurality of memory cells 112 configured as an aggregate to store data words. In some examples, the memory cells 112 are configured to store binary data. In some examples, each memory cell 112 is configured to store a single bit of binary data (e.g., as a '1' or '0'). In other examples, each memory cell 112 is configured to store a plurality of binary data bits. For example, each memory cell 112 may store a data value as a plurality of binary data bits. In particular, according to some examples, each memory cell 112 comprises a plurality of memory locations configured as an aggregate to store data bits corresponding to the data value. The plurality of data bits of the data value defines a width of the memory cell 112. In other examples, the memory cell 112 may store the data in a form other than as one or more binary bits.

According to various examples, the memory 110 may be implemented using substantially any memory technology. For example, memory cells 112 of the memory 110 may be implemented using static random access memory (SRAM) memory cells 112. In another example, one or more flip-flops such as, but not limited to, a D flip-flop, may be employed to implement the memory cells 112 of the memory 110. In other examples, yet another memory technology (e.g., DRAM, memristors, etc.) may be used to implement the memory cells 112 of the memory 110.

According to some examples, the memory 110 further comprises a controller 114. The controller 114 is configured to select a contiguous subset of the stored data words. The controller 114 is further configured to control shifting of the selected contiguous subset from a first location to a second location within memory 110. The selected contiguous subset has a length that is less than a total length of the memory 110, according to various examples of the principles described herein. Using one or more control signals, the controller 114 may cause the memory 110 to shift the selected contiguous subset by instructing the memory 110 to perform the shift, for example.

In various examples, the memory 110, or more generally the shiftable memory 100, facilitates one or both of an upshift and a downshift of the contiguous subset of data (e.g., data words). In particular, a memory cell 112 of the second location within the memory 110 may be located either above or below a corresponding memory cell 112 of the first location, depending on a direction of the shift. In some examples, the memory cell 112 of the second location is a single memory cell (or memory location) away from the corresponding memory cell 112 of the first location. In other words, the shift represents movement of the contiguous subset of stored data words by a single memory location or address. In other examples, the second location represents a movement of more than a single memory cell 112 away from the corresponding memory cell 112 of the first location. For example, the data words may be stored as a linear array of bits within the shiftable memory and the shift may be a number of bits equal to a length of the data word in bits.

In some examples, the selected contiguous subset is specified by both of an address of a first memory cell 112 of the contiguous subset and an address of a last memory cell 112 in the contiguous subset. For example, the first memory cell address and the last memory cell address are communicated to the controller 114 (e.g., via an address bus) to facilitate selecting the contiguous subset. The first memory cell address and last memory cell address may be communicated either sequentially as a first address followed by a second address over a single bus (e.g., ADDR 104), according to various examples. Alternatively, the first and last addresses may be communicated in parallel as two simultaneous addresses either over two buses or over two portions of a single, wide bus, for example.

In another example, the selected contiguous subset is specified by an address of the first memory cell 112 and a length of the contiguous subset (e.g., via ADDR 104 and LEN 106, as illustrated). In some of these examples, the length may be the length of the contiguous subset that follows the first memory cell 112 such that the last memory cell address is given by a sum of the first memory cell address and the length. In other examples, the length includes the first memory cell 112 such that the last memory cell address is given by the first memory cell address plus the length, minus one. Other examples may specify the last memory cell address and the length of the contiguous subset that precedes the last memory cell, as well as other schemes, for example.

In some examples, the controller 114 comprises an augmented decoder (not illustrated). The augmented decoder employs information regarding the address and length (or alternatively the first and last memory cell addresses) to select the contiguous subset of stored data. In some examples, the augmented decoder uses the information (e.g., address and length of the contiguous subset) to assert an output corresponding to each of the memory cells of the selected contiguous subset within the memory 110. Asserting an output may comprise outputting a logic '1' on a connection path or wire (e.g., a word line W) between the augmented decoder and the plurality of memory cells 112, for example. As such, the augmented decoder may output a logic '1' on a plurality of word lines of the memory 110, the word lines corresponding to the memory cells 112 that contain the stored data of the selected contiguous subset. The word lines may be connected to a load enable input or a select input of the memory cells 112, for example. In other examples, asserting an output comprises outputting a logic '0'. Asserting a logic '0' may be used when the memory cells 112 have a 'not' load enable input or a 'not' select input, for example. FIG. 2 omits explicit illustration of the load enable and select enable inputs for illustration expediency.

FIG. 3 illustrates a portion of a truth table of an augmented decoder, according to an example consistent with the principles described herein. In particular, the augmented decoder corresponding to the illustrated truth table is configured to select the contiguous subset in an example memory 110 having eight memory cells 112. The truth table has three address inputs (ADDR), a length (LEN) input and eight word lines W (i.e., $W_0$-$W_7$). The eight word lines W may correspond to load enable (LE) inputs of eight memory cells 112 in the example memory 110, for example. As can be seen in the truth table, for a value of LEN equal to '00', the augmented decoder functions substantially similar to a conventional decoder (i.e., only one word line W is asserted at a time). However, a plurality of word lines W are asserted for all other values of LEN to facilitate simultaneous enabling of a corresponding plurality of memory cells 112 that hold or store the selected contiguous subset of stored data words to be shifted.

In some examples, the augmented decoder may be implemented using a read only memory (ROM). The ROM is programmed with a truth table that specifies the functionality of the augmented decoder. A decoder of the ROM decodes an input (e.g., ADDR and LEN) and the programmed connections within the ROM augment the output of the ROM decoder to produce the augmented decoder functionality, for example. In another example, a conventional decoder may be augmented with an output circuit other than the programmed connections to implement the augmented decoder. In yet another example, the augmented decoder may be implemented using a latched ripple cascade.

Referring again to FIG. 2, the shiftable memory 100 supporting bimodal data storage further comprises a bimodal data storage operator 120. The bimodal data storage operator 120 is configured to operate on a data structure of data values comprising the contiguous subset of data words. Further, the bimodal data storage operator 120 is configured to provide in-place insertion of a data value using the built-in shifting capability, according to some examples. In some examples, the bimodal storage operator 120 provides in-place deletion of a data value, either in addition to or in lieu of in-place data insertion, which may or may not use the built-in shifting capability. For example, in-place deletion may be provided by replacing the data value with dummy data representing a hole in the data values of the data structure. By 'in-place' it is meant that the data value is inserted into or deleted from the data structure itself as opposed to employing a secondary or shadow data structure, for example. According to various examples, the bimodal data storage operator 120 may provide one or both in-place data value insertion and in-place data value deletion in either of word-aligned data structures or non word-aligned data structures.

In some examples, the bimodal data storage operator 120 is implemented as software or firmware (e.g., computer code or instructions) that is stored in a computer readable media and executed by a processor. The computer readable media may include, but is not limited to, various forms of computer memory (e.g., RAM, ROM, flash memory, etc.), a magnetic disk, and an optical disk of a computer system. The software or firmware of the bimodal data storage operator 120 may be executed by a processor that is part of a database management system employing the shiftable memory 100, for example.

In other examples, the bimodal data storage operator 120 is implemented in hardware. For example, the bimodal data storage operator 120 may be implemented as a machine code instruction of a processor (e.g., a microprocessor) that employs the shiftable memory 100. In another example, the bimodal data storage operator 120 may be one or both of implemented within and collocated with circuitry of the shiftable memory 100, itself. For example, the bimodal data storage operator 120 may be implemented as logic circuits that are part of the controller 114. In another example, the bimodal data storage operator 120 is implemented as an application specific integrated circuit (ASIC) that operates along side the controller 114, for example. In yet other examples, the bimodal data storage operator 120 may be implemented as part of a memory controller (not illustrated) that supports and provides an interface to the shiftable memory 100 as part of a memory subsystem. However, while the bimodal data storage operator 120 may be implemented remote from other portions of the shiftable memory 100, the bimodal data storage operator 120 is considered an element of the shiftable memory 100 by virtue of being configured to operate on the contiguous subset of data words within the memory 110, according to various examples.

In some examples, the shiftable memory 100 supporting bimodal data storage further comprises a control tag or flag. The control flag may be associated with each of a plurality of units of data in a data structure. For example, a data unit may be a data value and the control flag may be associated the data value. In another example, the data unit may be a data word, each data word in the data structure having an associated control flag. In yet other examples, the data unit may comprise either plurality of data words or a plurality of data values, the control flag being associated with the respective plurality. The control flag is configured to distinguish between data units (e.g., data values or data words) representing different storage modes of the bimodal data storage. In particular, the control flag may be configured to distinguish between padded or modified and unpadded or unmodified storage modes of the various associated data units, in some examples.

In some examples, the control flag is a control flag or a control bit that is appended to each of the data words of the data structure. For example, the control bit may be configured to indicate whether or not the data word is a padded data word. A data word having a control bit that is set to a binary '1' may indicate that the data word is a padded data word while the data word having a binary '0' control bit may indicate that the data word is unpadded, for example. Scanning the data words and observing the control bit facilitates identifying which data words are padded and which are unpadded, according to some examples.

In other examples, the control flag may be a control bit appended to each of the data values in the data words. For example, the control bit may be configured to identify whether or not the data value is a padded data value. A data value having a control bit that is set to a binary '1' may indicate that the data value is a padded data value while a binary '0' control bit may indicate that the data value is unpadded, for example. Again, determining whether a data value is padded or unpadded may be achieved by scanning the data values and observing the control bit, according to some examples.

In yet other example, a more complex, multi-bit, control flag may be employed. For example, the control flag may comprise a plurality of bits. The plurality of bits may encode not only the storage mode of either the data word or the data value but may also provide additional information. For example, the control flag comprising a plurality of bits may indicate which data value(s) of the data word are padded data values.

Figure 4A:
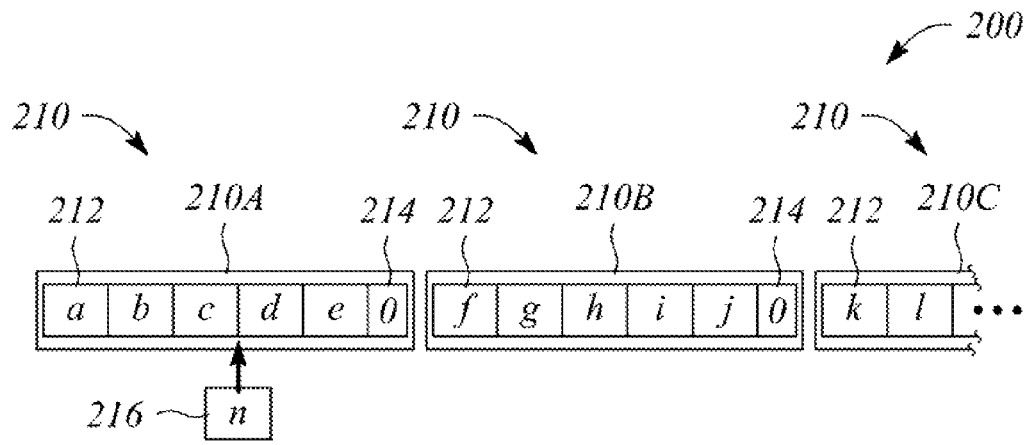
FIG. 4A illustrates a schematic diagram of a portion of a word-aligned data structure, according to an example consistent with the principles described herein.

FIG. 4A illustrates a schematic diagram of a portion of a word-aligned data structure 200, according to an example consistent with the principles described herein. For example, the word-aligned data structure 200 may be a column or a column fragment of a column-store database. Further, the word-aligned data structure 200 may be stored in shiftable memory that is substantially similar to the shiftable memory 100, described above, for example.

As illustrated, the word-aligned data structure 200 portion comprises a plurality of data words 210. Each data word 210 of the plurality includes five data values 212 (e.g., labeled 'a', 'b', 'c', 'd', 'e', etc.), as illustrated. Further as illustrated, each data word 210 of the plurality further includes a control bit 214 to indicate a storage mode (e.g., padded or unpadded) of the data word 210. For example, a data word 210 with a control bit 214 having a binary value '0' may indicate that the data word 210 is unpadded (or unmodified). Alternatively, though not illustrated in FIG. 4A, a padded data word 210 may be indicated by a control bit 214 having a binary value of '1', for example.

FIG. 4A also illustrates a data value 216 (e.g., 'n') that is to be inserted into the word-aligned data structure 200. In particular, the data value 216 is to be inserted into a first data word 210A at an insertion point between an identified pair of data values c and d, as illustrated by a heavy arrow in FIG. 4A. According to various examples, the insertion of the data value 216 may be provided by a bimodal data storage operator as an in-place insertion. The bimodal data storage operator may be substantially similar to the bimodal data storage operator 120 that employs shifting of some of the data words 210 using the built-in shifting capability of the memory 110 of the shiftable memory 100, according to some examples. Implicit in the schematic diagram of FIG. 4A is that the first data word 210A has been selected for insertion and further that the insertion is to be between the identified pair of data values c, d.

Figure 4B:
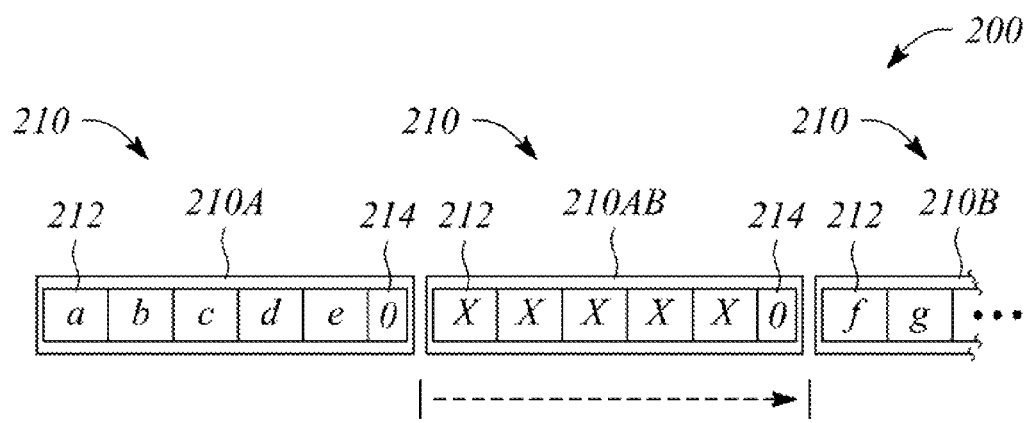
FIG. 4B illustrates a schematic diagram of the data structure portion illustrated in FIG. 4A following a shift of data words, according to an example consistent with the principles described herein.

FIG. 4B illustrates a schematic diagram of the data structure portion illustrated in FIG. 4A following a shift of data words 210, according to an example consistent with the principles described herein. In particular, FIG. 4B illustrates the result of a right shift of data words 210 starting with a second data word 210B. A dashed arrow illustrates the right shift in FIG. 4A. The right shift opens up a data-word sized space representing a new data word 210AB in the word-aligned data structure 200 between the first data word 210A and the second data word 210B. According to various examples, the right shift may be performed by or under the direction of the bimodal data storage operator 120 using the built-in shifting capability of the memory 110 of the shiftable memory 100. In some examples, the new data word 210AB may retain a copy of the data values 212 of the second data word 210B. In other examples, the new data word 210AB may be cleared by filling the new data word 210AB with one or more of '0' values, '1' values or an arbitrary string of characters. As such, the new data word 210AB is illustrated as having indeterminate data values labeled 'X', as illustrated.

Figure 4C:
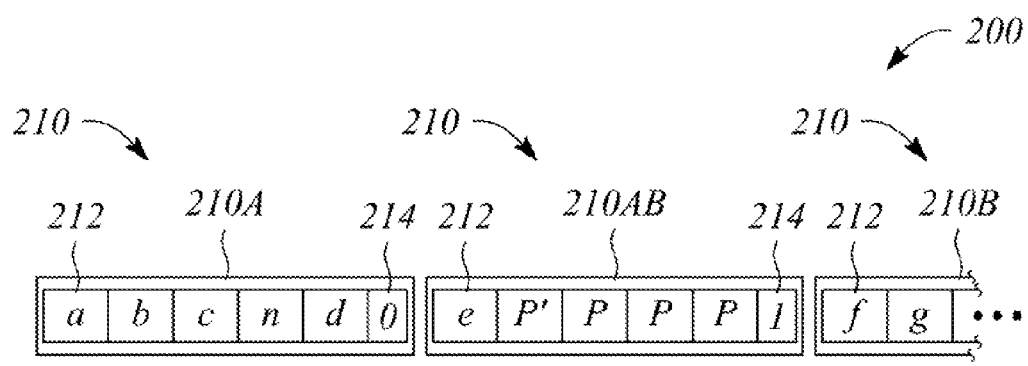
FIG. 4C illustrates a schematic diagram of the word-aligned data structure portion illustrated in FIG. 4B following an in-place insertion of a data value, according to an example consistent with the principles described herein.

FIG. 4C illustrates a schematic diagram of the word-aligned data structure 200 portion illustrated in FIG. 4B following an in-place insertion of a data value 212, according to an example consistent with the principles described herein. As illustrated in FIG. 4C, data values d, e to the right of the insertion point (identified in FIG. 4A) have been moved to make room for the data value 216 being inserted. In particular, the data value d next to the insertion point identified in FIG. 4A has been moved to a last data value position (next to the control bit 214, '0') in the first data word 210A. Further, the last data value e in the first data word 210A has been moved to a first data value position in the new data word 210AB. Further as illustrated, the new data word 210AB has been padded. For example, data value positions in the new data word 210AB beyond the data value e have been padded with a padding sequence. As illustrated, a padded data value P represents a padding sequence '0111 . . . ' (i.e., a '0' followed by a plurality of '1' values), while a padded data value P represents a padding sequence '111 . . . ' (i.e., all '1' values). As such, the padding sequence begins with a '0' followed by a plurality of '1' values. In addition, the control bit 214 of the new data word 210AB is set to '1' to indicate that the new data word 210AB is a padded data word 210.

When scanning the data structure 200 illustrated in FIG. 4C, a padded or modified data word 210 is readily identified by the control bit having a value of '1', for example. Once a padded data word 210 is located, a scan from an end of the word (e.g., starting with the control bit) until a first '0' is encountered readily enables locating and distinguishing valid data values 212 from the padding of the padded data word 210. In other examples, other padding schemes that also distinguish between the padding and the valid data values 212 may be employed (not illustrated).

Figure 5A:
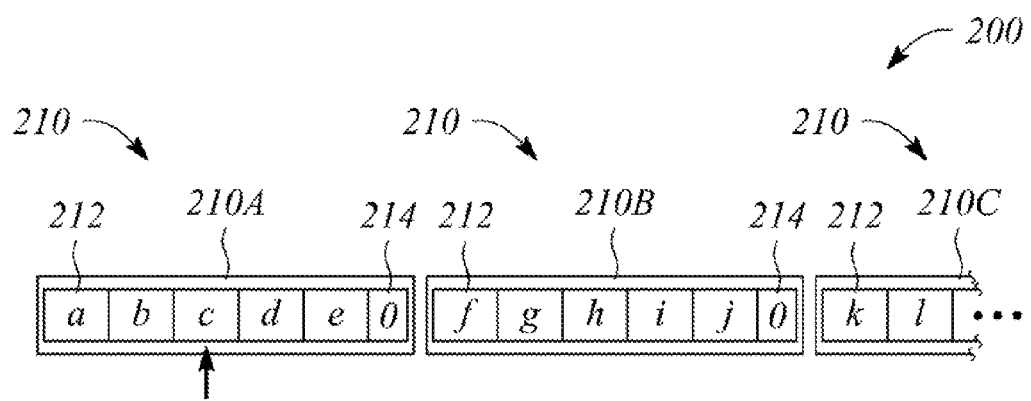
FIG. 5A illustrates a schematic diagram of a portion of a data structure, according to an example consistent with the principles described herein.

FIG. 5A illustrates a schematic diagram of a portion of a data structure 200, according to an example consistent with the principles described herein. In particular, the data structure 200 portion illustrated in FIG. 5A may be substantially similar to the data structure 200 portion illustrated in FIG. 4A. For example, the data structure 200 portion may be located in a shiftable memory having built-in shifting capability. In some examples, the data structure 200 portion illustrated in Figure SA may serve as a starting point for an example of in-place deletion of a data value 212. For example, a data value c of a data word 210A may be identified or selected for deletion using in-place deletion. A heavy arrow in Figure SA identifies the data value c that is to be deleted. The in-place deletion may be performed by a bimodal data storage operator that is substantially similar to the bimodal data storage operator 120 described above with respect to the shiftable memory 100, for example.

Figure 5B:
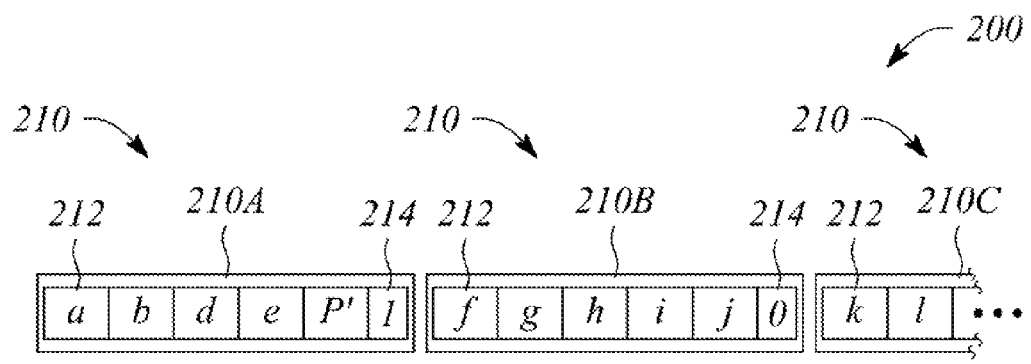
FIG. 5B illustrates a schematic diagram of the data structure portion illustrated in FIG. 5A following an in-place deletion of a data value, according to an example consistent with the principles described herein.

FIG. 5B illustrates a schematic diagram of the data structure 200 portion illustrated in FIG. 5A following an in-place deletion of a data value 212, according to an example consistent with the principles described herein. In particular, the bimodal data storage operator may remove the selected data value c to delete it from the data word 210A. The bimodal data storage operator may then move to the left the remaining data values d, e between the deleted data value c and a terminal end (at the right) of the data word 210A to compact the data values 212 of the data word 210A ('compaction'), in some examples. Finally, the bimodal data storage operator may pad the data word 210A with a '0' value followed by a plurality of '1' values (e.g., padding sequence P, as illustrated). As described above, valid data values 212 may be readily located by scanning a padded data word 210 (e.g., a data word having a control bit equal to '1') from the end until a '0' is encountered.

In some examples, the built-in shifting capability of the shiftable memory may be employed to compact valid data values 212 in the data structure 200 (not illustrated). For example, when a data word 210A becomes completely or fully padded, the bimodal data storage operator may employ the built-in shifting capability of the shiftable memory to perform a left shift of data words to a right of the fully padded data word 210 ('compaction'). The left shift moves a next data word 210 to overwrite the fully padded data word 210, for example. A fully padded data word 210 is a data word that has no remaining valid data values 212 due to a series of in-place deletions and instead is filled completely with padding (e.g., a '0' value followed by all '1' values), according to the above-described example.

Figure 6A:
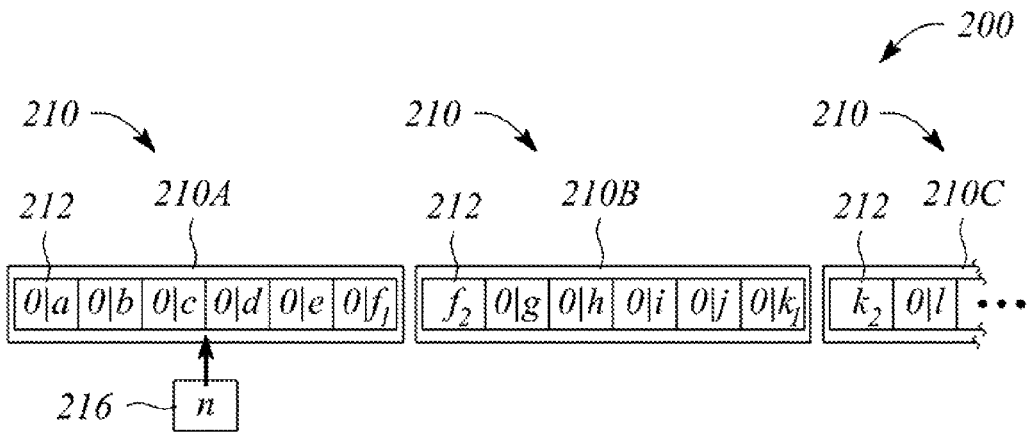
FIG. 6A illustrates a schematic diagram of a portion of a data structure, according to another example consistent with the principles described herein.

FIG. 6A illustrates a schematic diagram of a portion of a data structure 200, according to another example consistent with the principles described herein. In particular, the illustrated data structure 200 portion is non word-aligned. For example, the non word-aligned data structure 200 may be a column or a column fragment of a column-store database. Further, the non word-aligned data structure 200 may be stored in shiftable memory that is substantially similar to the shiftable memory 100, described above, for example.

As illustrated in FIG. 6A, the non word-aligned data structure 200 portion comprises a plurality of data words 210. Each data word 210 of the plurality includes a plurality of full data values 212. Further, each data word 210 may include one or two partial data values 212, in some examples. Herein a 'partial' data value 212 is a data value 212 that spans or is split between a pair of adjacent data words 210 while a 'full' data value 212 is a data value 212 that is entirely contained within a single data word 210. For example, a first data word 210A illustrated in FIG. 6A includes five full data values a, b, c, d, e and a first portion of a sixth data value f illustrated as a partial data value $f_1$. A second portion of the data value f is located at a beginning of a second data word 210B illustrated as a partial data value $f_2$. The second data word 210B also includes four full data values g through j and a second partial data value $k_1$.

Further as illustrated, each of the data values 212 further includes an associated control bit to indicate a storage mode (e.g., padded or unpadded) of the data value 212. For example, a data value 212 with a control bit having a binary value '0' may indicate that the data value 212 is unpadded (or unmodified). Alternatively, though not illustrated in FIG. 6A, a padded data value 212 may be indicated by a control bit having a binary value of '1', for example. According to some examples, the control bit may be a bit at a beginning of the data value 212 (e.g., a first bit preceding a bit representing the data value). For simplicity of illustration, the control bit is depicted as a value (e.g., '0' or '1') preceding and separated by a vertical line '|' from a letter (e.g., 'a') that designates the particular data value 212. As such, the data value a is illustrated as '0|a' when the control bit is '0'. Similarly, the data value e is illustrated as '0|e'. Since some data values 212 are split between data words 210 (e.g., the data value f is split between data words 210A and 210B), the control bit may be included in only one of the partial data values, according to some example. For example, the partial value $f_1$ includes the control bit (e.g., illustrated as '0|$f_1$' in FIG. 6A) while the partial value $f_2$ does not include a control bit.

FIG. 6A also illustrates a data value 216 (e.g., 'n') that is to be inserted into the non word-aligned data structure 200. In particular, the data value 216 is to be inserted into a first data word 210A at an insertion point between an identified pair of data values c and d, as illustrated by a heavy arrow in FIG. 6A. According to various examples, the insertion of the data value 216 may be provided by the bimodal data storage operator as an in-place insertion. The bimodal data storage operator may be substantially similar to the bimodal data storage operator 120 that employs shifting of some of the data words 210 using the built-in shifting capability of the memory 110 of the shiftable memory 100, according to some examples. Implicit in the schematic diagram of FIG. 6A is that the first data word 210A has been selected for insertion and further that the insertion is to be between the identified pair of data values c, d.

Figure 6B:
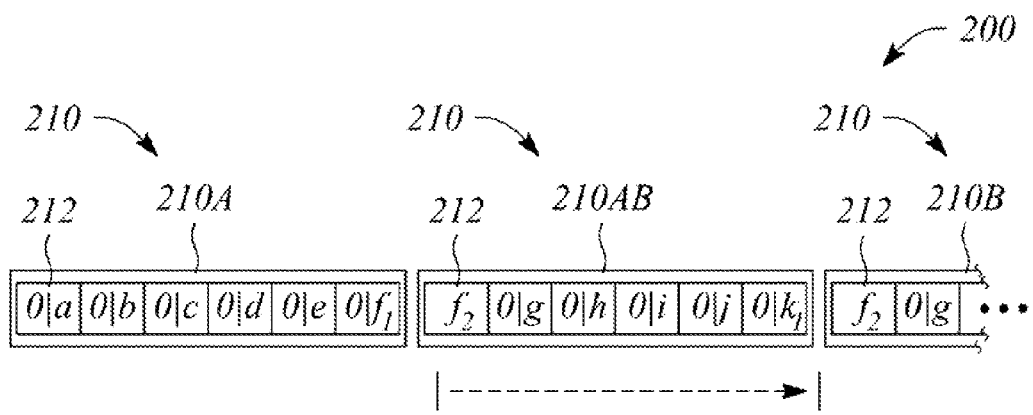
FIG. 6B illustrates a schematic diagram of the non word-aligned data structure portion illustrated in FIG. 6A following a shift of data words, according to an example consistent with the principles described herein.

FIG. 6B illustrates a schematic diagram of the non word-aligned data structure 200 portion illustrated in FIG. 6A following a shift of data words 210, according to an example consistent with the principles described herein. In particular, FIG. 6B illustrates the result of a right shift of data words 210 starting with a second data word 210B. A dashed arrow illustrates the right shift in FIG. 6A. The right shift opens up a data-word sized space representing a new data word 210AB in the word-aligned data structure 200 between the first data word 210A and the second data word 210B. According to various examples, the right shift may be performed by or under the direction of the bimodal data storage operator 120 using the built-in shifting capability of the memory 110 of the shiftable memory 100. Further as illustrated, the new data word 210AB retains a copy of the data values 212 of the second data word 210B, for example. In other examples (not illustrated), the new data word 210AB may be cleared by filling the new data word 210AB with one or more of '0' values, '1' values or an arbitrary string of characters.

Figure 6C:
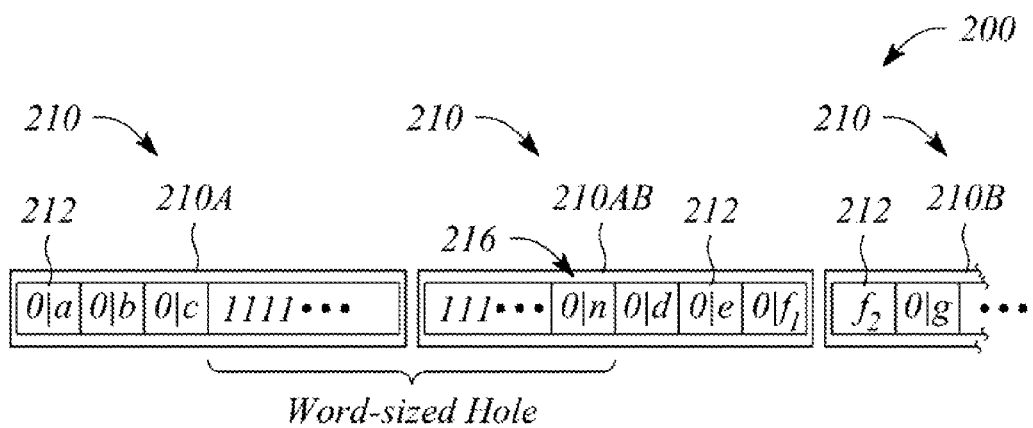
FIG. 6C illustrates a schematic diagram of the non word-aligned data structure portion illustrated in FIG. 6B following an in-place insertion of a data value, according to an example consistent with the principles described herein.

FIG. 6C illustrates a schematic diagram of the non word-aligned data structure 200 portion illustrated in FIG. 6B following an in-place insertion of a data value 212, according to an example consistent with the principles described herein. As illustrated in FIG. 6C, data values 212 to the right of the insertion point (e.g., full data values d, e and partial data value $f_1$) have been moved to an end of the new data word 210AB to make room for the data value 216 being inserted. Movement of data values 212 creates a 'hole' having a size equal to a data word. The data value 216 is inserted at an end of the word-sized hole closest to the moved data value d and a balance of the word-sized hole is padded. As illustrated, the padding comprises a padding sequence of '1' values. In addition, the control bit of the inserted data value 216 is set to '0', illustrated as '0|n' in FIG. 6C, by way of example.

When scanning the data structure 200 illustrated in FIG. 6C, a padded or modified data value 212 is readily identified by the control bit having a value of '1', for example. Once a padded data value 212 is located, a scan from left to right until a first '0' is encountered readily enables locating and distinguishing a next valid data value 212 (e.g., the inserted data value 216) from the padding sequence. In other examples, other padding schemes that also distinguish between the padding and the valid data values 212 may be employed (not illustrated).

An in-place deletion in a non word-aligned data structure may be accomplished by removing the data value being deleted and replacing the removed data value with a sequence of '1' values. As with the insertion case described above, when a control bit having a value '1' is encountered, a next valid data value 212 is readily identified by scanning from left to right until a '0' value (i.e., the control bit of the next valid data value 212) is encountered.

Figure 7:
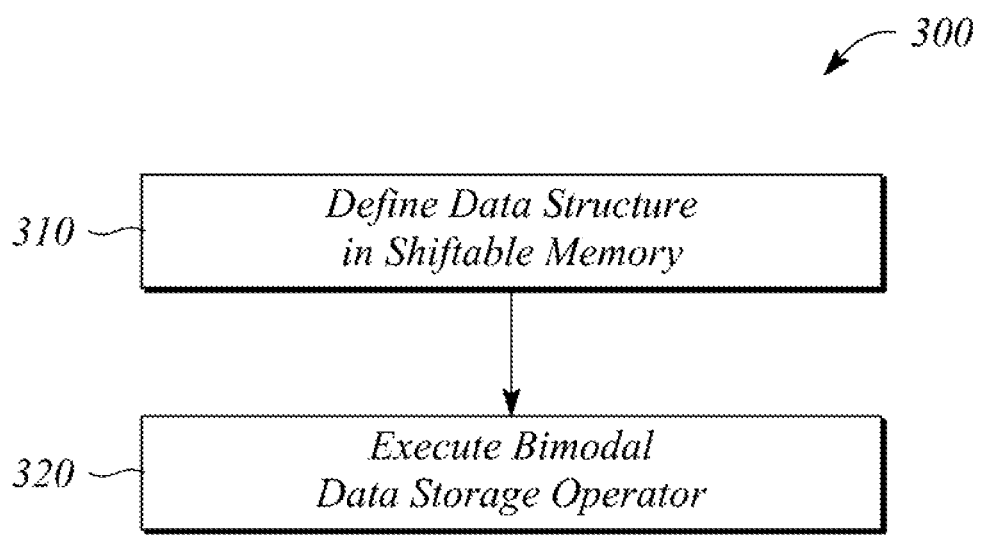
FIG. 7 illustrates a flow chart of a method of bimodal storage using shiftable memory, according to an example consistent with the principles described herein.

FIG. 7 illustrates a flow chart of a method 300 of bimodal storage using shiftable memory, according to an example consistent with the principles described herein. As illustrated, the method 300 of bimodal storage using shiftable memory comprises defining 310 a data structure in the shiftable memory. The data structure comprises data values stored in data words in the shiftable memory. The shiftable memory provides built-in shifting capability to shift a contiguous subset of data words in the data structure from a first location to a second location within the shiftable memory. In some examples, the shiftable memory is substantially similar to the memory 110 having built-in shifting capability described above with respect to the shiftable memory 100. In particular, a size of the contiguous subset of data words is less than a total size of the shiftable memory, according to various examples.

The method 300 of bimodal data storage using shiftable memory further comprises executing 320 a bimodal data storage operator. When executed 320, the bimodal data storage operator is configured to provide one or both of in-place insertion of a data value into the data structure using the built-in shifting capability and in-place deletion of an existing data value in the data structure that may or may not use the built-in shifting capability, according to various examples. In some examples, the bimodal data storage operator is substantially similar to the bimodal data storage operator 120 described above with respect to the shiftable memory 100.

In some examples, executing 320 the bimodal data storage operator provides in-place insertion of a data value. According to some examples, in-place data insertion comprises selecting a data word for insertion of the data value. In some examples, in-place data insertion further comprises shifting the contiguous subset of data words to create an open data word. The open data word may comprise a data word-sized space and may be substantially similar to the new data word 210AB described above. The contiguous subset may be adjacent to the selected data word and the created open data word may be between the selected data word and the shifted contiguous subset of data words, according to some examples. In-place insertion of a data value may further comprise moving a portion of the selected data word into the open data word to create an open space in the selected data word to receive the data value being inserted, according to some examples. Further, in-place insertion may comprise inserting the data value into the created space at an insertion point in the selected data word.

In some examples, the data structure may comprise word-aligned data values and in-place data insertion may be substantially similar to the in-place data insertion example described with respect to FIGS. 4A-4C. In particular, moving a portion of the selected data word may comprise moving any existing data values between the insertion point in the selected word and an end of the selected word to create the open space at the insertion point, for example. A last existing data value of the selected word may be moved into a beginning of the open data word, in some examples. Moving a portion may further comprise padding a remaining portion of the open data word beyond the moved last data value and changing a control bit of the open data word to indicate that the open data word is a padded data word. In the above-described example, a pair of storage modes of the bimodal data storage comprises padded data words and unpadded data words that are distinguished from one another by a state of the control bit.

In other examples, the data structure may comprise non word-aligned data values and in-place data insertion may be substantially similar to the in-place data insertion example described with respect to FIGS. 6A-6C. In particular, moving a portion of the selected data word may comprise moving any existing data values of the selected data word between the insertion point and an end of the selected data word into a terminal end of the open data word, for example. Moving a portion may further comprise inserting the data value adjacent to the moved existing data values and padding remaining portions of both of the selected data word and the open data word between the inserted data value and the moved existing data values at the end of the open data word. Further, moving a portion may comprise setting a control bit of the inserted data value to indicate that the inserted data value is a non-padded data value. In the above-described example, a pair of storage modes of the bimodal data storage comprises padded data values and unpadded data values that are distinguished from one another by the control bit associated with the data values.

In some examples, executing 320 the bimodal storage operator provides in-place deletion of an existing data value. In some examples, in-place deletion of an existing data value comprises identifying a data word containing the data value to be deleted and deleting the data value. When the data values are word aligned, a control bit of the identified data word is changed to indicate that the identified data word is padded, according to some examples. In some examples, in-place deletion may be substantially similar to the in-place deletion described with respect to FIG. 5A-5B. When the data values are non word-aligned, a control bit of the deleted data value is changed to indicate that the data value is padded, according to some examples.

In some examples, executing 320 the bimodal storage operator may provide an in-place update of data in the data structure. In particular, an in-place update may comprise both of an in-place insertion and an in-place deletion, according to some examples. For example, the in-place update may be provided by an in-place deletion of an existing data value followed by an in-place insertion of a new data value in the data structure. In other examples, the in-place deletion may follow the in-place insertion. In some examples, the in-place insertion inserts the new data value in a location within the data structure that differs from a location of the deleted existing value. Inserting in and deleting from different locations may be used to maintain a sorted order of the data values in the data structure, for example.

Thus, there have been described examples of a shiftable memory supporting bimodal data storage, and a method of bimodal data storage using shiftable memory. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A shiftable memory supporting bimodal data storage comprising:
   a memory to store data words, the memory providing built-in shifting capability to shift a contiguous subset of the data words from a first location to a second location within the memory, the built-in shifting capability to shift only data words of the contiguous subset having a size that is smaller than a total size of the memory; and
   a bimodal data storage operator to operate on a data structure comprising the contiguous subset of data words and to provide in-place insertion of a data value using the built-in shifting capability and provide in-place deletion of an existing data value by replacing the existing data value with dummy data representing a hole in the data structure,
   wherein a data word comprises data values.

2. The shiftable memory supporting bimodal data storage of claim 1, further comprising a tag associated with the data values of the data structure, the tag to distinguish between a padded storage mode and an unpadded storage mode of the bimodal data storage.

3. The shiftable memory supporting bimodal data storage of claim 2, wherein the tag is a control bit appended to each of the data words, the control bit to indicate whether or not the data word is a padded data word.

4. The shiftable memory supporting bimodal data storage of claim 2, wherein the tag is a control bit appended to each of the data values, the control bit to identify whether or not the data value is a padded data value.

5. The shiftable memory supporting bimodal data storage of claim 1, wherein the data structure is a column of a column-store database.

6. The shiftable memory supporting bimodal data storage of claim 1, wherein the bimodal storage operator to further provide data value compaction comprising using the built-in shifting capability to shift data words to delete a word-sized hole in the data structure.

7. A shiftable memory providing bimodal storage support comprising:
   a shiftable memory comprising a plurality of memory cells with built-in data shifting capability to shift a contiguous subset of data stored in the memory cells from a first location to a second location within the shiftable memory, a size of the contiguous subset being smaller than a total size of the shiftable memory;
   a control flag associated with a data unit of a plurality of units of data in a data structure comprising the contiguous subset of data, the control flag to indicate a storage mode of the data unit, wherein the built-in data shifting capability in conjunction with the control flag facilitate one or both of in-place insertion of data in the data structure and in-place deletion of data in the data structure.

8. The shiftable memory of claim 7, further comprising a bimodal data storage operator to operate on the plurality of units of data in the data structure and to provide the in-place insertion of data using the built-in shifting capability.

9. The shiftable memory of claim 7, wherein the data unit of the plurality of units of data is a data word and the control flag is a control bit of the data word.

10. A method of bimodal storage using shiftable memory, the method comprising:
    defining a data structure comprising data values stored in data words in the shiftable memory; the shiftable memory providing built-in shifting capability to shift a contiguous subset of the data words in the data structure from a first location to a second location within the shiftable memory, a size of the contiguous subset of data words being less than a total size of the shiftable memory; and
    executing a bimodal data storage operator to provide one or both of in-place insertion of a data value into the data structure using the built-in shifting capability and in-place deletion of an existing data value in the data structure by replacing the existing data value with dummy data representing a hole in the data structure.

11. The method of bimodal data storage of claim 10, wherein in-place insertion comprises:
    selecting a data word for insertion of the data value;
    shifting the contiguous subset of data words to create an open data word, the contiguous subset being adjacent to the selected data word and the created open data word being between the selected data word and the shifted contiguous subset of data words;
    moving a portion of the selected data word into the open data word to create an open space in the selected data word to receive the data value being inserted; and
    inserting the data value into the created space at an insertion point in the selected data word.

12. The method of bimodal data storage of claim 11, wherein when the data structure comprises word-aligned data values, moving a portion of the selected data word comprises:

moving any existing data values between the insertion point in the selected data word and an end of the selected data word adjacent to the open data word to create the open space at the insertion point, a last existing data value of the selected data word being moved into a beginning of the open data word; padding a remaining portion of the open data word beyond the moved last existing data value; and changing a control bit of the open data word to indicate that the open data word is a padded data word, wherein a pair of storage modes of the bimodal data storage comprises padded data words and unpadded data words that are distinguished from one another by a state of the control bit.

13. The method of bimodal data storage of claim 11, wherein when the data structure comprises data values that are not word-aligned, moving a portion of the selected data word comprises:

moving any existing data values of the selected data word between the insertion point and an end of the selected data word into a terminal end of the open data word; inserting the data value adjacent to the moved existing data values and padding remaining portions of both the selected data word and the open data word between the inserted data value and the moved existing data values at the end of the open data word; and setting a control bit of the inserted data value to indicate that the inserted data value is a non-padded data value, wherein a pair of storage modes of the bimodal data storage comprises padded data values and unpadded data values that are distinguished from one another by the control bit associated with the data values.

14. The method of bimodal data storage of claim 11, wherein in-place deletion of an existing data value comprises:

identifying a data word containing the data value to be deleted; and deleting the data value to be deleted, wherein when the data values are word aligned, a control bit of the identified data word is changed to indicate the identified data word is padded.

* * * * *